United States Patent [19]

Lockwood et al.

[11] Patent Number: 5,021,363
[45] Date of Patent: Jun. 4, 1991

[54] METHOD OF SELECTIVELY PRODUCING CONDUCTIVE MEMBERS ON A SEMICONDUCTOR SURFACE

[75] Inventors: Harry F. Lockwood, Waban; Margaret B. Stern, Sudbury; Marvin Tabasky, Peabody; Victor Cataldo, Wilmington, all of Mass.

[73] Assignee: Laboratories Incorporated, Waltham, Mass.

[21] Appl. No.: 404,237

[22] Filed: Sep. 7, 1989

[51] Int. Cl.$^5$ ............................................. H01L 21/44
[52] U.S. Cl. .................................. 437/200; 437/177; 437/192; 437/193
[58] Field of Search ................ 437/177, 200, 192, 193

[56] References Cited

U.S. PATENT DOCUMENTS

| | | | |
|---|---|---|---|
| 4,586,063 | 4/1986 | Nakamura et al. | 437/176 |
| 4,597,167 | 7/1986 | Moriya et al. | 437/187 |
| 4,735,913 | 4/1988 | Hayes | 437/177 |
| 4,751,101 | 6/1988 | Joshi | 427/124 |
| 4,880,753 | 11/1989 | Meakin et al. | 437/200 |
| 4,923,823 | 5/1990 | Kohno | 437/177 |

FOREIGN PATENT DOCUMENTS 62-114276  5/1987  Japan .
63-177419  7/1988  Japan .

OTHER PUBLICATIONS

Wolf et al., Silicon Processing for the VLSI Era, Lattice Press, Sunset Beach, pp. 303–308.
Ghezzo et al., Selective CVD Tungsten on Silicon Implanted $S_iO_2$ J. Electrochem Sec. Solid State Science & Technology, Jul. 1988, pp. 1730–1734.
Tsao et al. Low Pressure Chemical Vapor Deposition of Tungsten on Polycrystellin and Single-Crystal Silicon Via the Silicon Reduction J. Electrochem. Soc. Solid State Science and Technology, Nov. 1984, pp. 2702–2708.
Lamai et al., Evaluation of the Selective Tungsten Deposition Process for VLSI Circuit Application, J. Electrochem. Sec. Solid State Science and Technology Apr. 1988, pp. 980–984.

Primary Examiner—Brian E. Hearn
Assistant Examiner—Laura M. Holtzman
Attorney, Agent, or Firm—Victor F. Lohmann, III

[57] ABSTRACT

Method of forming conductive members on a substrate of GaAs. Silicon is placed on the substrate surface in the desired pattern of the conductive members. The substrate is exposed to a gaseous atmosphere containing $WF_6$. $WF_6$ is reduced by the silicon causing tungsten to selectively deposit on the silicon but not on the exposed GaAs. The substrate is given a rapid thermal annealing treatment which causes the silicon-tungsten elements to form conductive members having a silicon rich layer at the bottom, an intermediate tungsten silicide layer, and a tungsten rich layer at the top. The conductive members form ohmic contacts with underlying heavily doped GaAs and rectifying Schottky barrier contacts with underlying lightly doped GaAs.

4 Claims, 2 Drawing Sheets

METHOD OF SELECTIVELY PRODUCING CONDUCTIVE MEMBERS ON A SEMICONDUCTOR SURFACE

BACKGROUND OF THE INVENTION

This invention relates to semiconductor materials. More particularly, it is concerned with methods of producing conductive members on the surfaces of substrates of semiconductor material.

In the fabrication of compound semiconductor devices, for example GaAs, different metallization systems are employed for forming Schottky barrier contacts, ohmic contact to N-type material, and ohmic contacts to P-type material. Typically, refractory metal Schottky barrier contacts are formed by sputtering tungsten or tungsten silicide over the substrate surface and then patterning by employing well known photolithography liftoff and metal etching techniques. Ohmic contacts to GaAs are formed by photolithography and metal liftoff techniques using different metal systems depending whether the ohmic contact is to N-type or P-type material. That is, for each of these contacts a different metallization system and a separate set of processing steps is required. If more than one type of contact is required, there are problems in obtaining accurate alignment between processes.

SUMMARY OF THE INVENTION

In an improved method of selectively producing conductive members on a surface of a substrate in accordance with the present invention, a substrate is provided having a surface. A first material is placed on selected areas of the surface in a pattern to define the desired conductive members. The substrate is exposed to a material which reacts with the first material to form a layer of conductive material in the pattern defined by the first material. The second material does not react with the material of the substrate.

In another aspect of the invention conductive members are produced by providing a substrate having a surface. A layer of silicon is placed on areas of the surface in a pattern to define a conductive member. The substrate is exposed to an atmosphere containing a tungsten compound which reacts with the silicon to form a layer of tungsten in the pattern defined by the silicon and which does not react with the material of the substrate.

In a further aspect of the invention a semiconductor device is fabricated by providing a substrate of lightly doped compound semiconductor material having a surface. A layer of silicon is placed on an area of the surface to define a rectifying barrier contact member. The substrate is exposed to a tungsten containing atmosphere to cause a layer of tungsten to form on the layer of silicon, tungsten not forming on the remainder of the surface. Conductivity type imparting material of one conductivity type is ion implanted into portions of the substrate at the surface to form heavily doped zones of the one conductivity type adjacent to the area underlying the layer of silicon. The layer of tungsten and the layer of silicon mask the underlying compound semiconductor material from the conductivity type imparting material during ion implantation. The substrate is heated to activate the conductivity type imparting material implanted in the zones, and to cause the tungsten and silicon to react and form a conductive member of a silicon rich layer, a tungsten silicide layer, and a tungsten rich layer with the conductive member in rectifying contact with the underlying lightly doped compound semiconductor material.

In another aspect of the present invention, a semiconductor device is fabricated by providing a substrate of a compound semiconductor material having two heavily doped zones of one conductivity type separated by a lightly doped zone exposed at a surface of the substrate. Separate, isolated layers of silicon are placed over portions of the surface of each of the zones. The substrate is exposed to a tungsten containing atmosphere to cause layers of tungsten to form on the layers of silicon; tungsten not forming on the exposed semiconductor material on the surface. The substrate is then heated to cause tungsten and silicon of the layers to react and form conductive members; each conductive member having a silicon-rich layer, a tungsten silicide layer, and a tungsten-rich layer. The conductive members overlying the two heavily doped zones form ohmic contacts therewith, and the conductive member overlying the lightly doped zone forms a rectifying barrier therewith.

In the figures the various elements are not drawn to scale. Certain dimensions are exaggerated in relation to other dimensions in order to present a clearer understanding of the invention.

For a better understanding of the present invention, together with other and further objects, advantages, and capabilities thereof, reference is made to the following discussion and appended claims in connection with the above-described drawings.

DETAILED DESCRIPTION

In fabricating devices in accordance with the present invention as illustrated in the figures, a substrate of single crystal compound semiconductor material is provided as a supporting structure. As is well understood, the substrate is usually a slice or wafer of relativity large surface area upon which many devices are fabricated to produce a plurality of identical devices or an integrated circuit structure. However, for purposes of illustration, the fabrication of only a single device, a field effect transistor (FET), in a fragment of a slice will be shown and described.

Figure 1A:
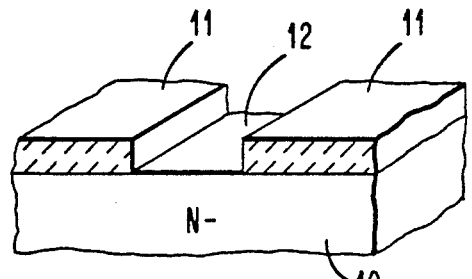
FIGS. 1A-1E are a series of perspective views in cross-section illustrating a fragment of a wafer of gallium arsenide at various stages in the fabrication of a field effect transistor employing a method of the present invention.

A slice or wafer having a lightly doped surface layer of a compound semiconductor material with a flat, planar, major surface, a fragment 10 of which is shown in FIG. 1A, is produced by any of the known techniques of crystal fabrication including epitaxial growth techniques. In the present embodiment under discussion the compound semiconductor material of the fragment 10 is N-type GaAs. Other compound semiconductor materials as is well known may be used, particularly the III–V semiconductor materials such as InP, InAs, InGaAs, GaAlAs, and InGaAsP.

In carrying out the method illustrated in FIGS. 1A–1E, the surface of the fragment 10 is coated with an organic protective material as polyimide or photoresist 11. By employing known photolithographic masking etching techniques an opening 12 is formed therein which exposes the surface of the underlying fragment 10 in a pattern to define a desired area for an FET gate electrode as will be apparent from the following discussion.

Figure 1B:
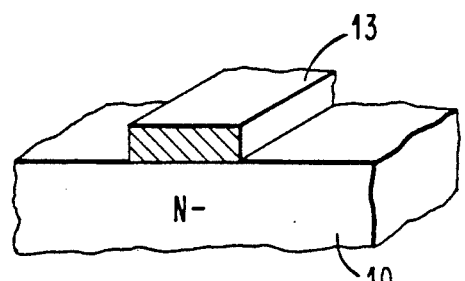
Figure 1C:
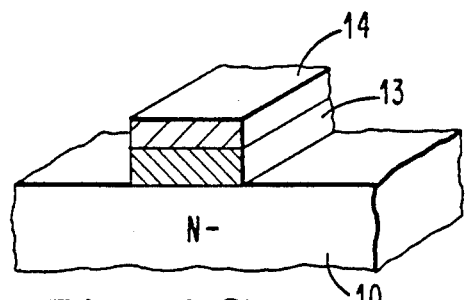

A layer of silicon of between 1500 and 3000 angstroms thick is deposited over the entire surface by conventional e-beam techniques. As illustrated by FIG. 1B the underlying organic layer 11 is then removed by employing known lift-off techniques to leave a layer of silicon 13 adherent to the surface area defined by the opening 12 in the organic layer.

Next, the wafer is cleaned and then placed in a suitable low pressure chemical vapor deposition apparatus. The apparatus is evacuated to a suitable pressure and heated to a suitable temperature. Reactant gases of $WF_6$ and $H_2$ are introduced into the apparatus. As is known, the $WF_6$ and $H_2$ react with the silicon to form a deposit of tungsten on the exposed silicon surfaces. The reactant gases do not react with the exposed GaAs, and therefore tungsten 14 is selectively deposited only on the silicon layers 13. (FIG. 1C) A layer of tungsten 14 of between 800 and 2000 angstroms is formed on the silicon layer 13. Thus, an essential feature of the method of the present invention is the utilization of a material, such as silicon, together with other materials, specifically including a tungsten containing material, such that the tungsten containing material reacts with the silicon to deposit tungsten but does not react with the underlying substrate material, specifically GaAs.

After being removed from the tungsten deposition apparatus, the wafer is placed in ion implantation apparatus. A conductivity type imparting or doping material, specifically silicon, is ion implanted into the surface of the wafer by employing known techniques to form heavily doped regions 15 and 16. (FIG. 1D) During the ion implantation procedure the tungsten and silicon layers 14 and 13 are of sufficient thickness to provide a mask for the ion implantation so that the underlying GaAs is not affected by the doping material being implanted.

Figure 1D:
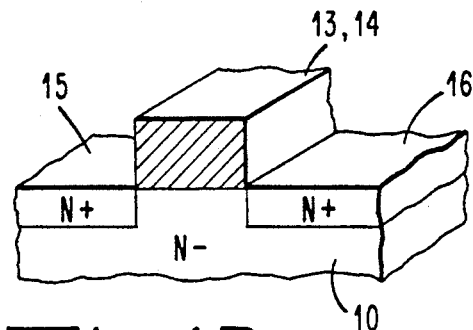

Following the ion implantation procedure the wafer is subjected to a heat treatment of rapid thermal annealing in an annealing furnace for a period of 5 to 10 seconds at a activates the implanted ions in the regions 15 and 16 illustrated in FIG. 1D, and in addition the rapid thermal annealing treatment causes further reaction of the silicon and tungsten in the layers 13 and 14. A conductive member 13-14 is produced which includes a silicon rich layer contiguous with the surface of the wafer, then a layer of tungsten silicide, and an upper tungsten rich layer. The conductive member 13-14 forms a rectifying or Schottky barrier contact to the underlying lightly doped GaAs.

Figure 1E:
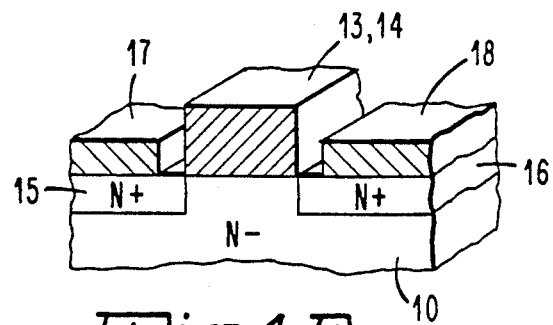

Metal contacts 17 and 18 as illustrated in FIG. 1E may then be formed on the regions 15 and 16, respectively, by employing known photolithographic and metal lift-off techniques. As illustrated in FIG. 1E, the resulting device is an FET having source and drain regions 15 and 16 with appropriate ohmic contacts 17 and 18, respectively, together with a Schottky barrier contact 13-14 serving as a gate electrode over the channel region between the source and drain regions 15 and 16.

In a specific example, a substrate 10 of GaAs in lightly doped with N-type doping material. A layer 11 of an organic protective material is spin coated on the surface of the substrate. The layer 11 in selectively masked and etched to produce an opening 12. Electron beam evaporation apparatus is employed to deposit a layer of silicon 13 1500 angstroms thick on the wafer. The remaining organic layer 11 and organic layer and the overlying silicon are removed by lift off in solvents. The wafer is then cleaned by dipping in a dilute HF solution for approximately 1 minute. The clean wafer is placed in a quartz tube in a low pressure chemical vapor deposition apparatus. The tube is evacuated to a pressure of $3 \times 10^{-6}$ torr at a temperature of 300° C. Hydrogen is introduced into the tube and the tube is baked out at 300° C. for 1 hour at a partial pressure of 120 millitorr. The apparatus is then evacuated to a pressure $3 \times 10^{-6}$ torr. The reactant gases $WF_6$ and $H_2$ are introduced into the tube in a 1 to 50 ratio by volume. The pressure is 920 millitorr and the temperature is 300° C. The deposition process in carried out for 40 minutes to produce a tungsten deposit about 1500 angstroms thick. Ion implantation of silicon to form heavily doped regions 15 and 16 is carried out in conventional apparatus. Rapid thermal annealing treatment is carried out by heating the wafer at a temperature of 850° to 950° C. for a period of 5 to 10 seconds.

Figure 2A:
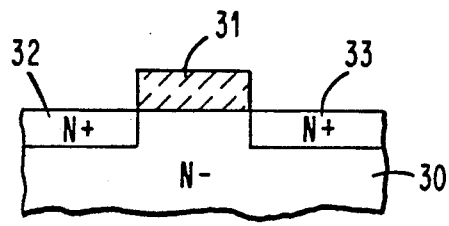
FIGS. 2A-2E are a series of elevational views in cross section of a fragment of a wafer of gallium arsenide illustrating successive steps in the fabrication of a field effect transistor employing a method of the present invention.
Figure 2B:
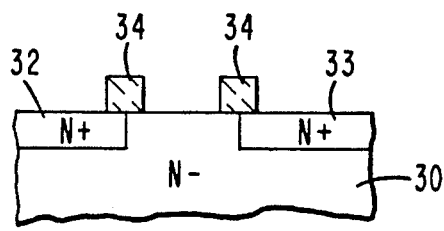

FIGS. 2A–2E illustrate a modified method in accordance with the present invention for fabricating an FET in a III–V compound semiconductor substrate 30 such as GaAs. By employing known techniques for producing FET's, a device is fabricated by forming a protective coating of silicon nitride 31 overlying the intended channel region of the device. N-type conductivity imparting material is introduced into zones at the surface of the substrate by employing known ion implantation techniques to produce source and drain regions 32 and 33 (FIG. 2A). As is well known, the layer of silicon nitride 31 protects the underlying GaAs from the ions being implanted in the adjacent source and drain regions.

Next, the silicon nitride masking layer 31 is removed and the surface of the wafer 30 is coated with a layer of silicon dioxide, silicon nitride, or other protective material 34. The protective layer 34 (FIG. 2B) is removed in the desired pattern employing known photolithographic masking and etching techniques to leave exposed the regions on which it is desired to produce Schottky and ohmic type contact members.

Figure 2C:
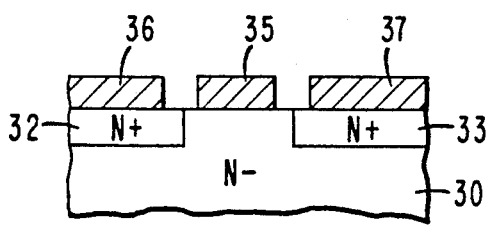

Silicon is then deposited over the entire surface of the masked wafer as by sputtering or other known deposition procedures. The protective masking material 34 is removed employing conventional etching procedures to leave on the surface of the wafer layers of silicon 35, 36, and 37 overlying portions of the gate region, the source region, and the drain region, respectively (FIG. 2C).

Figure 2D:
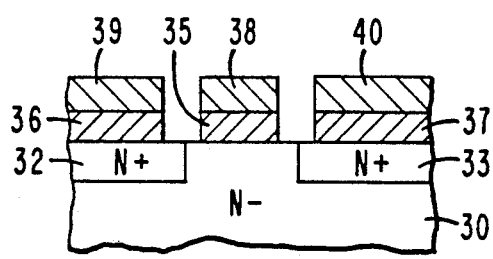
Figure 2E:
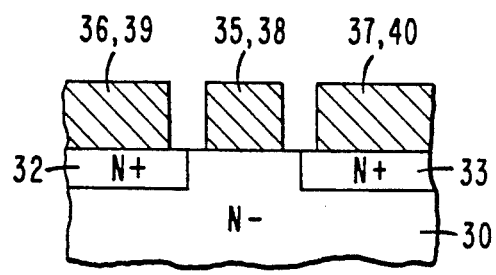

The wafer is placed in a low pressure chemical vapor deposition apparatus and exposed to reactant gases $WF_6$ and $H_2$ as discussed hereinabove to selectively form tungsten layers 38, 39, and 40 overlying the silicon layers 35, 36, and 37, respectively (FIG. 2D). As explained hereinabove, tungsten does not form on the exposed surface areas of GaAs. The substrate is then subjected to a rapid thermal annealing treatment in an annealing furnace in accordance with the procedures discussed hereinabove so as to form the conductive members 35-38, 36-39, and 37-40 (FIG. 2E). As noted previously, each conductive member has a silicon rich layer at the bottom, an intermediate tungsten silicide layer, and a tungsten rich layer on top.

The contact member 35-38 which overlies the lightly doped channel region of the FET forms a rectifying or Schottky barrier junction with the underlying GaAs and is the gate electrode. The contact members 36-39 and 37-40 to the heavily doped, low resistivity regions 32 and 33 form ohmic contacts to those regions. Thus, both the rectifying contacts and the ohmic contacts are formed simultaneously during the same processing steps with the same metallization being used for all contact members. The FET device may be completed in the usual manner by protecting and passivating the junctions that are exposed at the surface and by forming interconnections to other circuit elements as desired.

Although in the embodiments described hereinabove the substrate material is GaAs, other semiconductive materials may be employed. Furthermore, the method of the invention may be utilized for forming conductive interconnection members between elements fabricated on substrates of insulating material, for example sapphire. Although the ohmic contacts discussed herein are made to N-type conductivity semiconductor material, the process also produces ohmic contacts to semiconductor material which is heavily doped with P-type doping material.

The process of selectively depositing tungsten on silicon in which the silicon serves as a reducing media for the $WF_6$ gas is well established. As stated, the $WF_6$ gas does not react with GaAs, and therefore tungsten selectively forms on the exposed silicon. Other combinations of materials having the same relative characteristics in which a metal-containing gaseous atmosphere reacts with a material placed on a substrate surface but does not react with the exposed substrate surface similarly may be employed to produce conductive members.

The foregoing methods thus provide processes whereby both Schottky rectifying barrier contacts and ohmic contacts may be formed by employing the same metallization system. In the fabrication of certain devices only a single metallization step is required to form ohmic contacts to either N-type or P-type material and also at the same time to form Schottky barrier contacts. In addition, the process requires no metal etching of the metallized contact in order to define the contact structure. That is, the contact metal is selectively deposited and requires no patterning treatment to remove unwanted material. The pattern of the silicon layer once established aligns the subsequent tungsten metallization automatically, and also precisely aligns any doped regions produced by subsequent ion implantation.

While there has been shown and described what are considered preferred embodiments of the present invention, it will be obvious to those skilled in the art that various changes and modifications may be made therein without departing from the invention as defined by the appended claims.

What is claimed is:

1. The method of fabricating a semiconductor device comprising
    providing a substrate of compound semiconductor material having a lightly doped first zone with a first surface area at a surface of the substrate and having a heavily doped second zone of one conductivity type with a second surface area at said surface;
    placing a first layer of silicon on a portion of said first surface area of said first zone and placing a second layer of silicon on a portion of said second surface area of said second zone with the remainder of said surface begin uncovered;
    exposing the substrate to an atmosphere containing a tungsten compound which reacts with the silicon to form a first layer of tungsten on said first layer of silicon and a second layer of tungsten on said second layer of silicon and which does not react with the material of the substrate;
    heating to cause tungsten of the first and second layers of tungsten to react with silicon of the first and second layers of silicon to form first and second conductive members, respectively, each having a layer of tungsten silicide so that the first conductive member overlying said portion of the first surface area forms a rectifying barrier with the underlying lightly doped compound semiconductor material of said first zone and the second conductive member formed overlying said portion of the second surface area forms an ohmic contact with the underlying heavily doped compound semiconductor material of said second zone.

2. The method in accordance with claim 1 wherein the thickness of said layer of silicon placed on said surface is about 1500 angstroms.

3. The method of fabricating a semiconductor device comprising
    providing a substrate of lightly doped compound semi-conductor material having a surface;
    placing a layer of silicon on an area of said surface to define a rectifying barrier contact member with the remainder of said surface being uncovered;
    exposing the substrate to a tungsten containing atmosphere to cause a layer of tungsten to form on said layer of silicon, tungsten not forming on the uncovered remainder of said surface;
    ion implanting a conductivity type imparting material of one conductivity type into portions of said substrate at said surface to form heavily doped zones of the one conductivity type adjacent to said area underlying said layer of silicon, said layer of tungsten and said layer of silicon masking the underlying compound semiconductor material from the conductivity type imparting material being ion implanted; and
    heating said substrate to activate the conductivity type imparting material implanted in said zones and to cause the tungsten and silicon to react and form a conductive member of a silicon-rich layer a tungsten silicide layer and a tungsten-rich layer with said conductive member in rectifying contact with the underlying lightly doped compound semiconductor material.

4. The method of fabricating a semiconductor device comprising
    providing a substrate of a compound semiconductor material having two heavily doped zones of one conductivity type separated by a lightly doped zone exposed at a surface of the substrate;
    placing separate, isolated layers of silicon over portions of the surface of each of said zones with the remainder of said surface being uncovered;
    exposing the substrate to a tungsten-containing atmosphere to cause layers of tungsten to form on said layers of silicon, tungsten not forming on the exposed compound semiconductor material of the uncovered remainder of said surface; and heating said substrate to cause the tungsten and silicon of said layers to react and form conductive members, each being of a silicon-rich layer a tungsten silicide layer and a tungsten-rich layer with the conductive members overlying the two zones of heavily doped compound semiconductor material forming ohmic contacts therewith and with the conductive member overlying the zone of lightly doped compound semiconductor material forming a rectifying barrier therewith.

* * * * *